United States Patent [19]

Campbell

[11] Patent Number: 5,602,773
[45] Date of Patent: Feb. 11, 1997

[54] MEMORY DEVICE COLUMN ADDRESS SELECTION LEAD LAYOUT

[75] Inventor: John P. Campbell, Garland, Tex.

[73] Assignee: Texas Instruments Incorporated, Dallas, Tex.

[21] Appl. No.: 477,845

[22] Filed: Jun. 7, 1995

Related U.S. Application Data

[62] Division of Ser. No. 247,914, May 23, 1994, Pat. No. 5,485,419.

[51] Int. Cl.⁶ .................................................. G11C 5/08
[52] U.S. Cl. .................................................. 365/69; 365/63
[58] Field of Search .................................. 365/69, 63, 72, 365/51; 257/207, 208, 758

[56] References Cited

U.S. PATENT DOCUMENTS 4,941,031  7/1990  Kumagai et al. .................. 357/45
5,014,110  5/1991  Satoh .................................. 357/68

*Primary Examiner*—A. Zarabian
*Attorney, Agent, or Firm*—Robby Holland; Leo Heiting; Richard Donaldson

[57] ABSTRACT

A semiconductor memory device (20) includes N bitlines (31, 32, 33, 34) addressable by a partially decoded column address, wherein N is greater two. A column address selection lead (YSEL) has plural segments, each of which overlays a length of one of the bitlines. Each segment of the column address selection lead overlays no more than approximately 1/N of the length of a bitline. Adjacent column address selection leads are separated by approximately the pitch of N–1 bitlines.

4 Claims, 4 Drawing Sheets

MEMORY DEVICE COLUMN ADDRESS SELECTION LEAD LAYOUT

This is a division of application Ser. No. 08/247,914 filed May. 23, 1994, now U.S. Pat. No. 5,485,419 issued Jan. 16, 1995.

FIELD OF THE INVENTION

This invention relates to dynamic random access memory (DRAM) devices and more particularly to the layout of bitlines and column address selection leads across an array of storage cells.

BACKGROUND OF THE INVENTION

During the procedure of laying out the paths of bitlines and column address selection leads in a dynamic random access memory (DRAM), a designer considers the effect of parasitic capacitance between adjacent leads, such as bitlines and column address selection leads, which run parallel to one another. Because bitlines typically carry very small signals, the effects of parasitic capacitance are very important and must be distributed with great care to assure proper operation of the memory devices. In this regard, it is important that every bitline should have very nearly the same amount of parasitic capacitance as every other bitline. The total of all parasitic capacitance for all of the bitlines should be minimized to conserve power consumption.

In the prior art, the column address selection lead over most of its length is laid out wide enough to overlap both leads of a bitline and thereby equally distribute parasitic capacitance between the two leads of the bitline. In this writing, the term overlap refers to the width of the selection lead being wide enough to cover both leads of a bitline.

Because only one column address selection lead was used with every two bitlines, a special layout was designed. Each column address selection lead has been routed to overlay one bitline for half the distance across the array and to overlay the second bitline across the other half of the array. The column address selection leads are routed around metal straps used for bitline twists, or crossovers. Overlay refers to the length of the address selection lead that runs parallel with a bitline.

In a later prior art design concept, four bitlines are addressed by a single column address selection lead. This leaves one surplus column address selection lead for every four bitlines. Because of the need for equal parasitic capacitance for every bitline, the surplus column address selection leads have been left in place on the memory device. These surplus leads maintain the magnitude of parasitic capacitance of the prior art and thereby cause a continuing high level of power consumption. Each surplus lead may potentially cause the device to be defective because of the close proximity to other active leads. There is a single bitline width, or pitch, between adjacent column address selection leads.

It is a problem to remove the excess parasitic capacitance and increase the column address selection lead spacing without disturbing the balance of parasitic capacitance among the bitlines.

SUMMARY OF THE INVENTION

These and other problems are resolved by a semiconductor memory device that includes N bitlines addressable by a partially decoded column address, wherein N is greater than two. A column address selection lead has plural segments, each of which overlays a portion of one of the bitlines. Each segment of the column address selection lead overlays no more than approximately 1/N of the length of each bitline.

Parasitic capacitance between each of the bitlines and the respective segments of the column address selection lead are approximately balanced.

Adjacent column address selection leads are separated by approximately the pitch of N–1 bitlines.

BRIEF DESCRIPTION OF THE DRAWINGS

A better understanding of the invention may be derived by reading the following detailed description with reference to the drawings wherein.

DETAILED DESCRIPTION

Figure 1A:
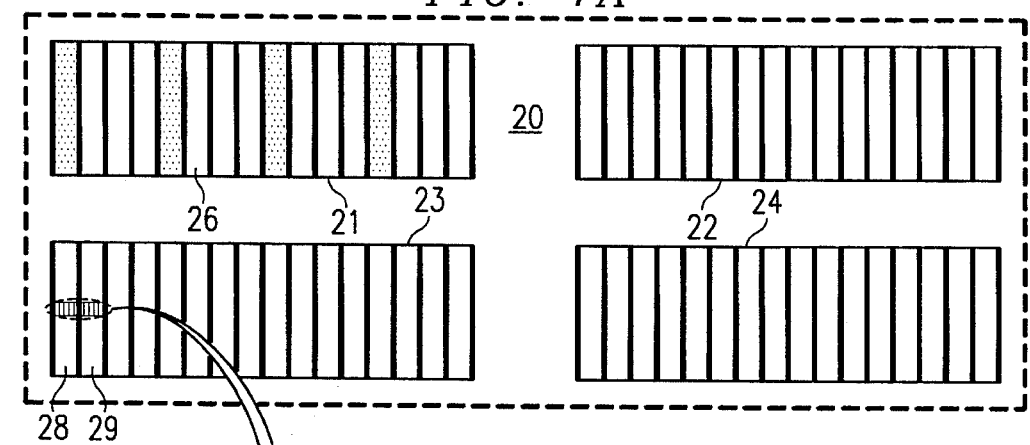
FIG. 1A is a plan view of the layout of four quadrant arrays of storage cells in a dynamic random access memory device.
Figure 1B:
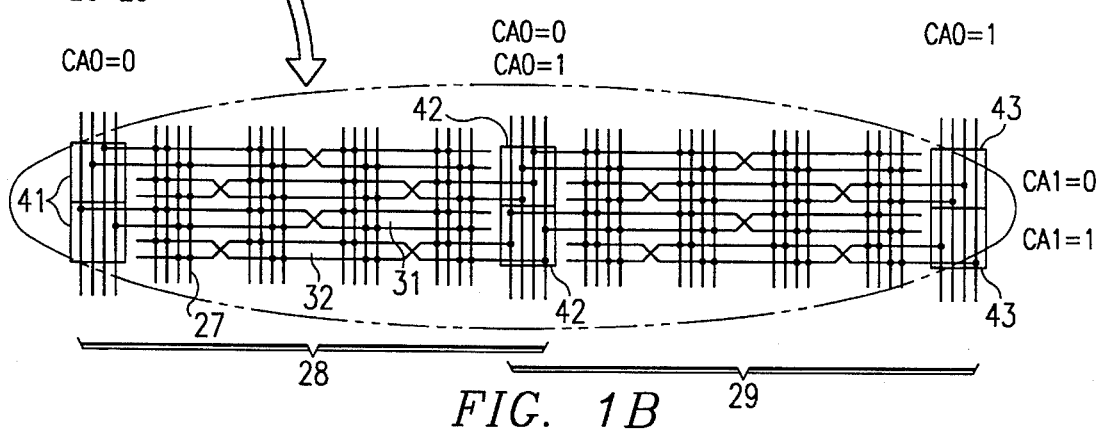
FIG. 1B is an enlarged view of an indicated portion of FIG. 1A.

Referring now to FIGS. 1A and 1B, a semiconductor dynamic random access memory (DRAM) device 20 is divided into four quadrants 21, 22, 23 and 24. Each quadrant of the device 20 includes sixteen equal size blocks of storage cells, e.g., block 26. The storage cells of the blocks are arranged in addressable rows and columns.

The memory device 20 is laid out so that each storage cell is located at a unique intersection of one row address and one column address. This location is known as the address of the storage cell. A row of storage cells is accessed by decoding a row address to select a wordline, e.g., wordline 27, that enables a transistor transfer gate in each of the storage cells of the row. A group of columns is selected for writing data into or reading data out of the cells of the columns by partially decoding a column address to access sense amplifiers, associated with the respective columns. A column address is partially decoded when a group of N columns, or bitlines, is selected rather than the single column of the applied address. Bitlines run through the array so that all of the storage cells of a column are interconnected by way of a bitline to the sense amplifier associated with that column. Each bitline includes both a true lead and a complement lead.

In FIG. 1A, the bitlines traverse from left to right across each of the sixteen blocks of each of the four quadrants. The two leads of each bitline are parallel to each other throughout their lengths except for transpositions, or crossovers, which occur in a pattern. There is a triple twist pattern of the crossovers laid out among the bitlines.

As shown in detail in the enlarged area of FIG. 1B, there are four (N equals four) exemplary bitlines traversing each of two blocks 28 and 29 of the quadrant 23. These four bitlines are selected by the applied address. In the block 28, a bitline 31 includes one transposition, or crossover, in the center of the block. An adjacent bitline 32 has two transpositions within the block 28. These two transpositions are offset from the single transposition of the bitline 31. The number of transpositions, or crossovers, used in the adjacent bitlines 31 and 32 equals three and is termed the triple twist pattern mentioned previously. This triple twist pattern is repeated regularly throughout the array of storage cells to minimize crosstalk between bitlines.

When a data bit is to be written into a selected storage cell, that data bit presets the state of a sense amplifier which interconnects with two leads BL and $\overline{BL}$ of the bitline associated with the selected storage cell. The preset state of the sense amplifier writes that state, a one or a zero, into the storage cell.

When a stored data bit is to be read out of a selected storage cell, the two leads BL and $\overline{BL}$ of the associated bitline are first precharged to a precharge potential. Then the charge of the data bit stored in the selected storage cell is added to the precharge potential on one of the two leads BL and $\overline{BL}$. As a result, a differential voltage is created between the leads $\overline{BL}$ and is sensed by the connected sense amplifier. Sense amplifiers 41, 42 and 43 are associated with the bitlines shown in the blocks 28 and 29 of FIG. 1B.

Because the sense amplifiers 41, 42 and 43 detect small differences of potential between the two leads of a bitline, it is very important to equalize parasitic capacitance between the leads of each bitline. That is, the capacitance of the lead BL should be balanced with the capacitance of the lead $\overline{BL}$. Also the capacitance of each bitline should be balanced with the capacitance of other bitlines.

Figure 2:
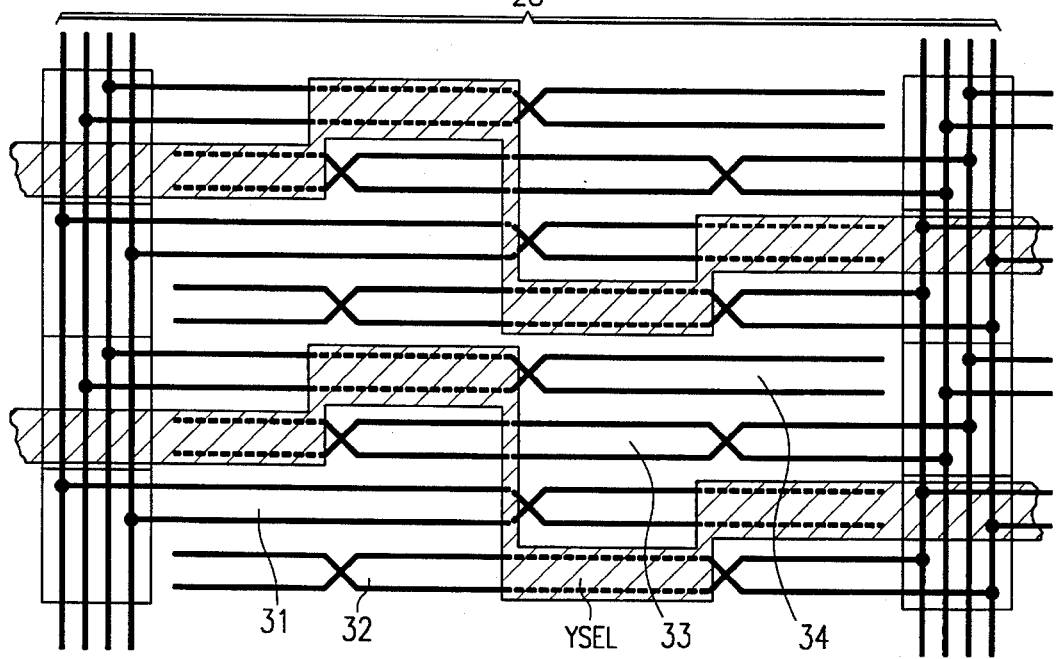
FIG. 2 is a plan view of eight bitlines and two column address selection leads in a section of one array of memory cells shown in FIG. 1.

Accessing of the sense amplifier, associated with a selected bitline, is accomplished by applying an enabling signal over a column address select, or Y-select, lead YSEL that is shown in FIG. 2. The Y-select lead YSEL traverses the memory block, e.g., the block 28 of FIG. 1B, in a direction that is parallel with the bitlines traversing the block.

Referring now to FIG. 2, there is shown a layout of the bitlines 31, 32, 33 and 34 of the block 28 of FIG. 1B. Typically the bitlines are conductors that are fabricated out of polysilicon or silicided polysilicon. Also in FIG. 2, there is shown the Y-select lead YSEL which overlays a length of each of the bitlines 31, 32, 33 and 34. The Y-select lead YSEL over most of its length is wide enough to cover, or overlap, both leads BL and $\overline{BL}$ for the length of each bitline 31, 32, 33 and 34 that it overlays. Thus the Y-select lead YSEL overlay of each bitline equals the overlay of each of the others, and the parasitic capacitances of the bitlines, caused by the Y-select leads, are equal to each other and are balanced.

The Y-select lead YSEL overlays approximately 1/N, or a quarter, of the length of each bitline 31, 32, 33 and 34. Considering that in the prior art half of the length of each bitline was covered by the Y-select lead, there is a reduction of bitline parasitic capacitance as a result of the disclosed novel layout. Reduction of the bitline parasitic capacitance will be described in greater detail hereinafter.

As shown in FIG. 2, the Y-select lead YSEL overlays the bitline 33 for one quarter of its length. Then the Y-select lead YSEL turns, or bends, to overlay the bitline 34 for a quarter of its length. Continuing, the Y-select lead YSEL turns, or bends, again and again to overlay the bitlines 32 and 31 for a quarter of each of their lengths. Thus each of the N, or four, bitlines 31, 32, 33, and 34 is overlayed by the Y-select lead YSEL for 1/N, or twenty-five per cent, of its length. The order in which the bitlines are overlayed in not critical, but the pattern is repeated for other groups of bitlines, as shown in FIG. 2 and throughout the memory device 20 of FIG. 1A.

It is noted that although it is not shown in the drawings, a similar concept can be used for groups of N equal to eight, sixteen, or more bitlines which might be selected by partially decoding the column address. The percent overlay of the length of each bitline would be approximately (1/N) (100), where N equals the number of bitlines selected by the partial decoding of the column address and is greater than 2.

Figure 3:
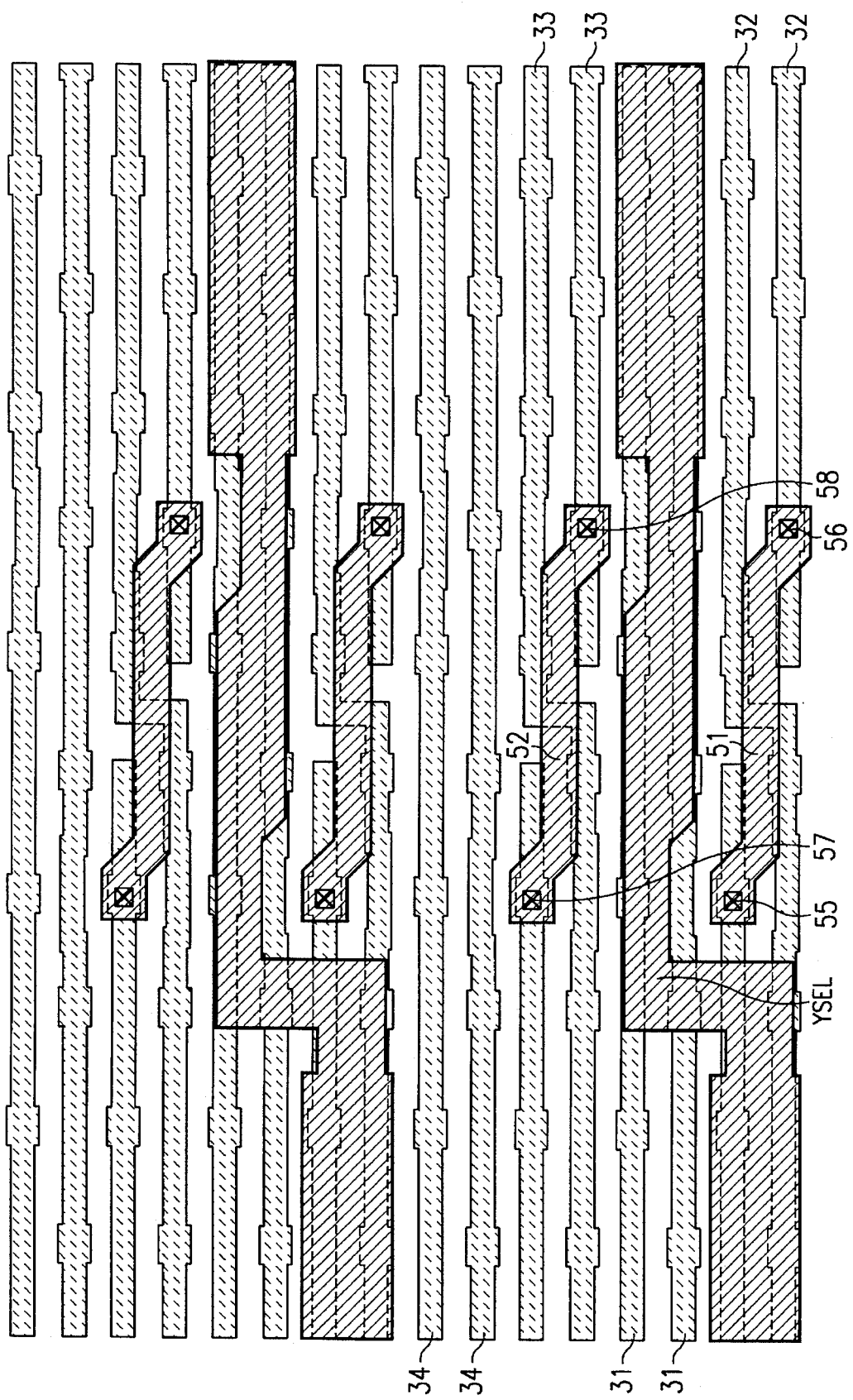
FIG. 3 is a plan view of a layout of a short portion of eight bitlines with crossover links and two address selection leads.

Referring now to FIG. 3, there is shown a more detailed layout of a part of the length of the bitlines 31, 32, 33 and 34 with crossovers 51 and 52 and the Y-select lead YSEL. Interconnect conductors 55, 56, 57 and 58 connect the bitlines 32 and 33 with the respective crossover links 51 and 52. As previously mentioned, an insulator is positioned between the layer of the polysilicon or silicided polysilicon bitlines and the metal layer including the crossover links and the Y-select lead.

Figure 4:
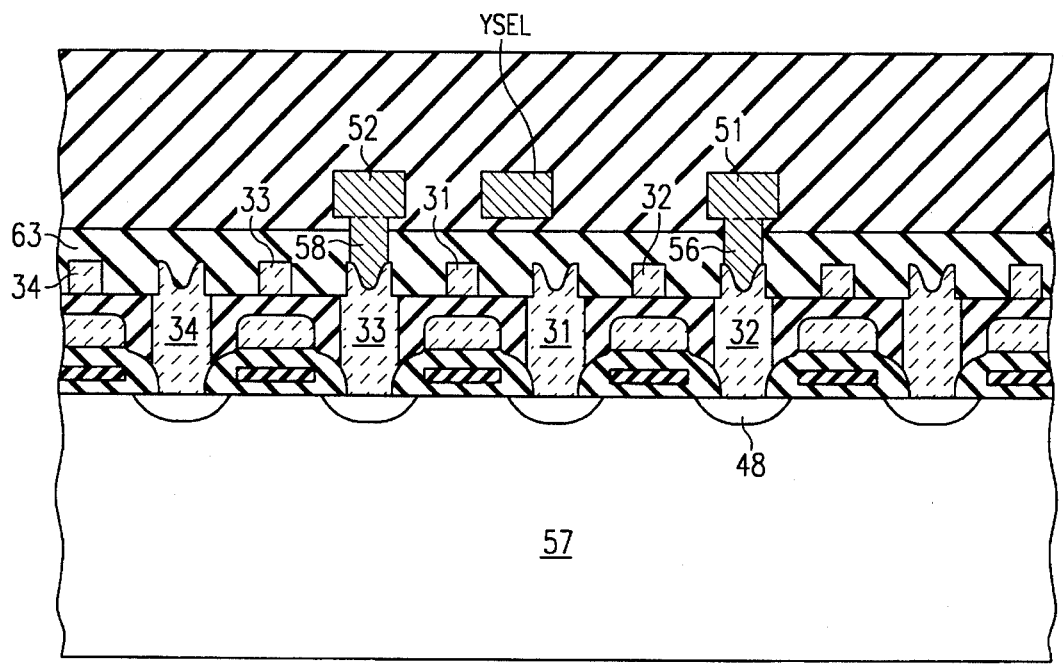
FIG. 4 is a cross-sectional view of a part of a memory device with bitlines, an address selection lead, crossovers, and interconnections.

FIG. 4 is a cross-section of an integrated circuit memory device that embodies several of the bitlines and a Y-select lead of the layout of FIGS. 2 and 3. In FIG. 4 a source/drain region 48 of a transfer gate transistor is located at the surface of the device substrate 57. Each bitline 31, 32, 33 and 34 includes two conductors fabricated in polysilicon. An insulator layer 63 of multilevel oxide covers the bitlines 31, 32, 33 and 34. Overlaying the bitlines 31, 32, 33 and 34 and the insulator layer 63 is a multiple metal layer including the Y-select lead YSEL. Contact 56 connects one lead of the bitline 32 with a crossover strap 51 that is also formed in the multiple metal layer with the Y-select lead YSEL. Another contact 58 connects one lead of the bitline 33 with another crossover strap 52 which is a part of the multiple metal layer.

Figure 5:
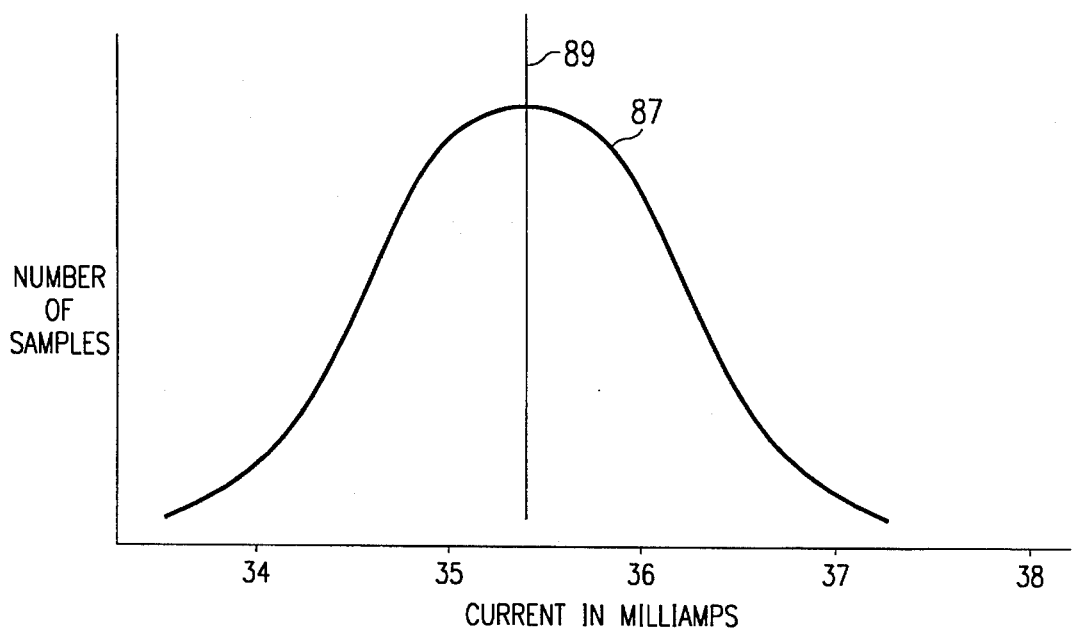
FIG. 5 is a graphical representation of current consumption during operation of many samples of memory devices fabricated in accordance with the exemplary embodiment of the invention.

Referring now to FIG. 5, there is shown an envelope 87 of power supply current test results from a large group of sample devices, fabricated in accordance with the design of FIGS. 1–4. In FIG. 5 the mean power supply current, as represented by line 89, is approximately equal to 35.4 milliamps. Power consumption is proportional to the square of the magnitude of the current.

Figure 6:
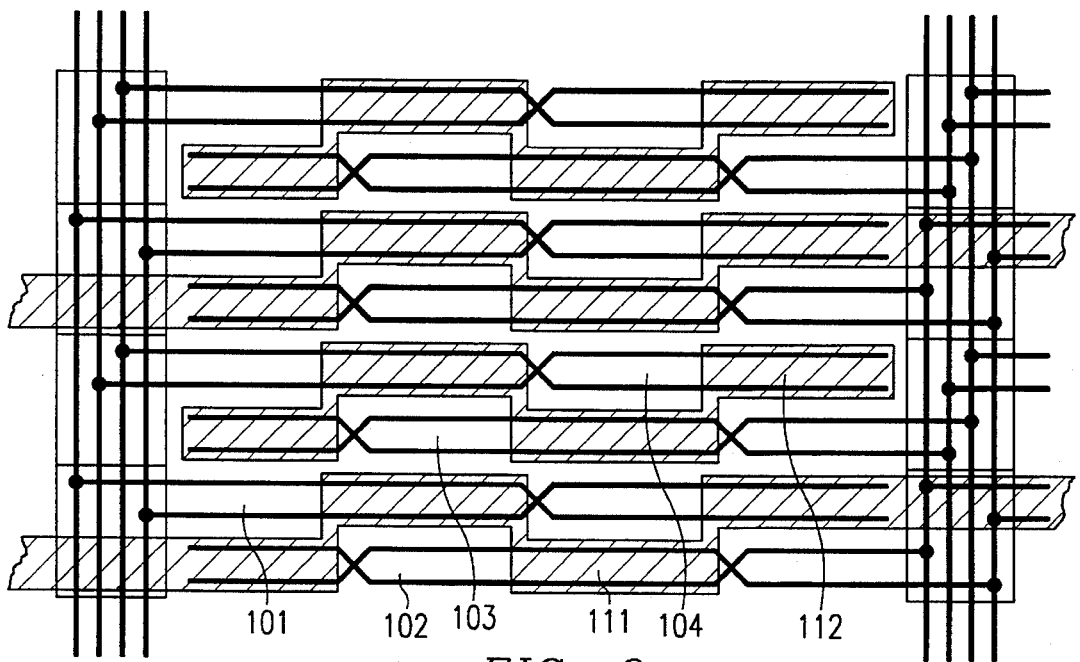
FIG. 6 is a plan view of eight bitlines and four column address selection leads in a section of a prior art array of memory cells.

Referring now to FIG. 6, there are four bitlines 101, 102, 103 and 104 that are laid out in the triple twist pattern, described with respect to the layout shown in FIG. 1B. In FIG. 6, there are two Y-select leads 111 and 112, each of which covers portions of two pairs of the bitlines, in accordance with the prior art layout of the Y-select leads. In the layout of FIG. 6, each Y-select lead overlays approximately half, or fifty per cent, of the length of each of the associated bitlines. The Y-select leads 111 and 112 overlay the portions of the bitlines so that there is matching parasitic capacitance for each bitline.

Figure 7:
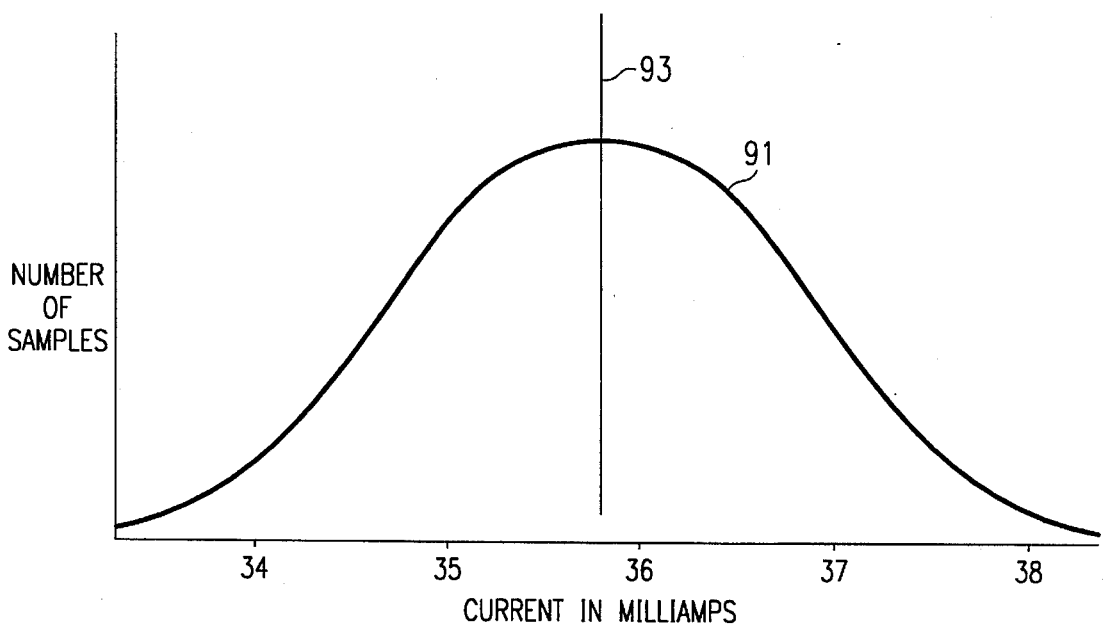
FIG. 7 is a graphical representation of current consumption during operation of many samples of memory devices fabricated in accordance with the prior art layout of FIG. 6.

Referring now to FIG. 7, there is shown an envelope 91 of power supply current test results, from a large group of sample devices fabricated in accordance with the prior art design of FIG. 6. In FIG. 7, the mean power supply current, as represented by a line 93, is approximately equal to 35.8 milliamps, which is higher than the mean power supply current, shown in FIG. 5, for the advantageous design of FIGS. 1–4. Power consumption of the prior art arrangement is higher than the power consumption of the arrangement of FIGS. 1–4 by the ratio of the squares of respective power supply currents.

Because of the need to balance the parasitic capacitance for the bitlines, it is not possible to simply eliminate every other Y-select lead from the arrangement of FIG. 6 when the partial decoding of column addresses accesses four bitlines rather than the original two bitlines. Such an elimination of every other Y-select lead would leave every other pair of bitlines without an associated Y-select lead and its associated parasitic capacitance. Thus there would be an imbalance of parasitic capacitance between the bitlines, and that imbalance would cause faulty operation.

In addition to the reduction in power supply current, at least two other advantages result from the layout of FIGS. 1–4. The first advantage results from the lesser overlay of the Y-select leads to the bitline leads in FIG. 2 compared to the overlay of the Y-select leads to the bitline leads in FIG. 6. Referring to FIG. 4, the probability of a conductive defect extending from the bitline 31, protruding through the insulating multilevel oxide 63, and making an unwanted connection to a Y-select lead YSEL is reduced. Another advantage is that the separation between adjacent Y-select leads YSEL in the layout of FIG. 2 is greater than the separation between adjacent Y-select leads 111 and 112 of FIG. 6. In terms of bitline pitch, the separation between Y-select leads YSEL equals one less than the number of bitlines accessed by each Y-select lead. This additional separation between Y-select leads YSEL of FIG. 2 decreases the risk of damaging defects occurring during the fabrication of the memory device.

The foregoing describes an illustrative embodiment of applicant's invention. That embodiment together with others, made obvious in view thereof, are considered to fall within the scope of the appended claims.

What is claimed is:

1. A semiconductor memory device having storage cells arranged in an array and addressable by row and column addresses, the device comprising:

a group of N bitlines addressable by a partially decoded column address, each of the bitlines is fabricated as a pair of leads with a pitch between bitlines in a first conductive layer and N is greater than two;

first and second column address selection leads fabricated in a second column layer wherein the first and second column address selection leads are separated by approximately the pitch of N–1 bitlines except at some bends in the first and second column address selection leads; and an insulator separates the first conductive layer from the second conductive layer.

2. A semiconductor memory device having storage cells arranged in an array and addressable by row and column addresses, the device comprising:

a group of N bitlines addressable by partially decoding a column address, each of the bitlines is fabricated as a pair of leads in a first conductive layer and N is greater than two;

first and second column address selection leads fabricated in a second conductive layer wherein the first and second column address selection leads are separated by a first distance that is approximately the same as a second distance between N–1 bitlines except at some bends in the first and second column address selection leads; and an insulator separates the first conductive layer from the second conductive layer.

3. A semiconductor memory device having storage cells arranged in an array and addressable by row and column addresses, the device comprising:

a group of N bitlines addressable by a partially decoded column address, each of the bitlines is fabricated as a pair of leads in a first conductive layer and N is greater than two;

first and second column address selection leads fabricated in a second conductive layer wherein the first and second column address selection leads are separated by a first distance that is approximately the same as a second distance of N–1 bitline pitches; and an insulator separates the first conductive layer from the second conductive layer.

4. A semiconductor memory device having storage cells arranged in an array and addressable by row and column addresses, the devicecomprising:

a group of N bitlines addressable by partially decoding a column address, each of the bitlines is fabricated as a pair of leads in a first conductive layer and N is greater than two;

first and second column address selection leads fabricated in a second conductive layer wherein the first and second column address selection leads are separated by a first distance that is approximately the same as a second distance between N–1 bitlines; and an insulator separates the first conductive layer from the second conductive layer.

* * * * *